United States Patent [19]

Massingill et al.

[11] Patent Number: 4,695,805

[45] Date of Patent: Sep. 22, 1987

[54] APPARATUS FOR GENERATING SIGNALS SYNCHRONIZED TO AN UNSTABLE EXTERNAL SIGNAL

[75] Inventors: Larry W. Massingill; Derrick O. Perkins, both of Raleigh, N.C.

[73] Assignee: OnLine Computer Systems Inc., Germantown, Md.

[21] Appl. No.: 733,483

[22] Filed: May 13, 1985

[51] Int. Cl.[4] ............ H03K 17/00; H03K 17/26; H03K 5/13
[52] U.S. Cl. ............................. 328/72; 328/63; 328/155; 307/262; 307/269
[58] Field of Search ............... 307/262, 269; 328/133, 328/155, 63, 72, 109; 331/172, 1 R, DIG. 2; 375/111, 119

[56] References Cited

U.S. PATENT DOCUMENTS 3,983,498 9/1976 Malek ............................. 328/155

Primary Examiner—Stanley D. Miller
Assistant Examiner—Timothy P. Callahan
Attorney, Agent, or Firm—Finnegan, Henderson, Farabow, Garrett & Dunner

[57] ABSTRACT

Apparatus for synchronizing an internally generated signal with an externally generated periodic or aperiodic signal to generate a periodic output signal phase synchronized with the externally generated signal comprising a local reference signal source, a sampling phase detector, a wide angle phase shifter, and a reference locked phase locked oscillator to achieve the phase alignment of the desired output signal to the input reference signal. The apparatus may contain an optional signal conditioner to condition the input reference signal for processing within the apparatus.

7 Claims, 9 Drawing Figures

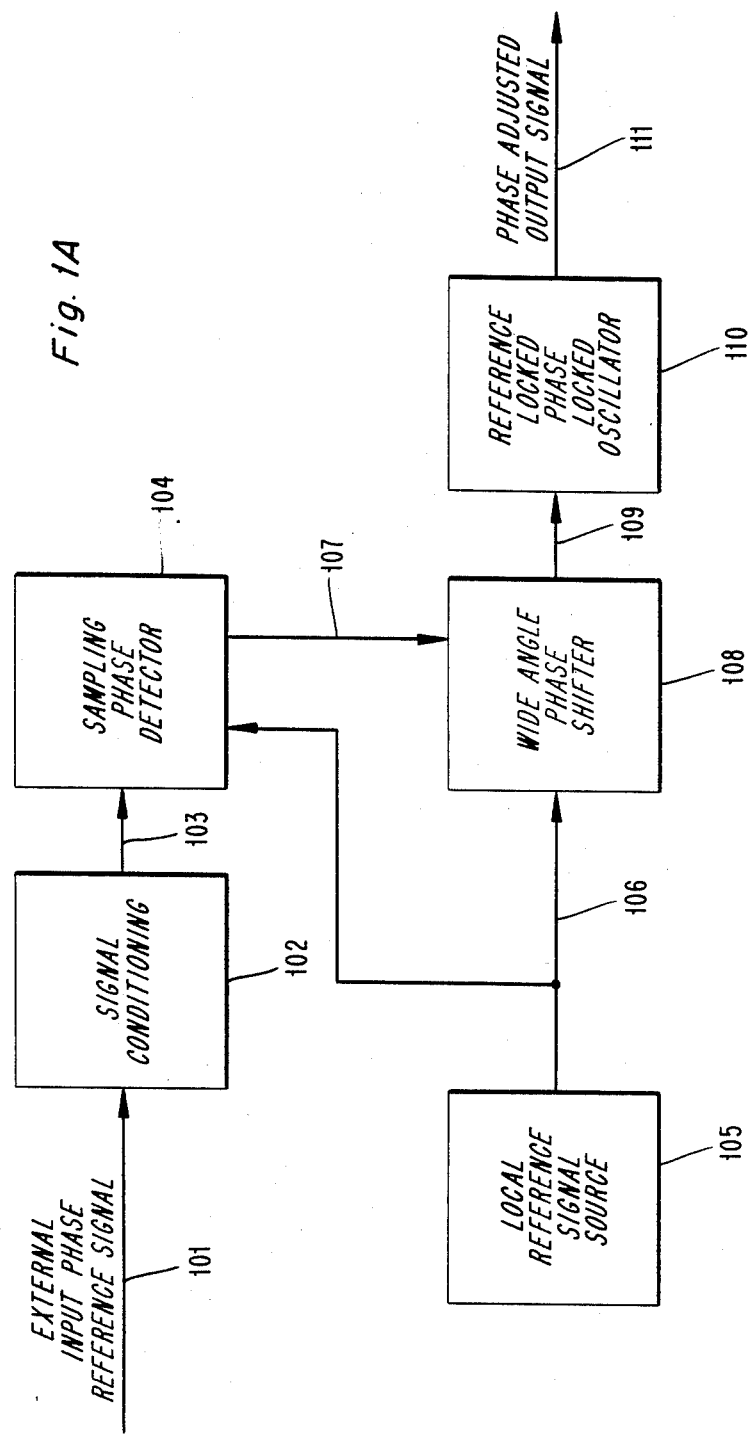

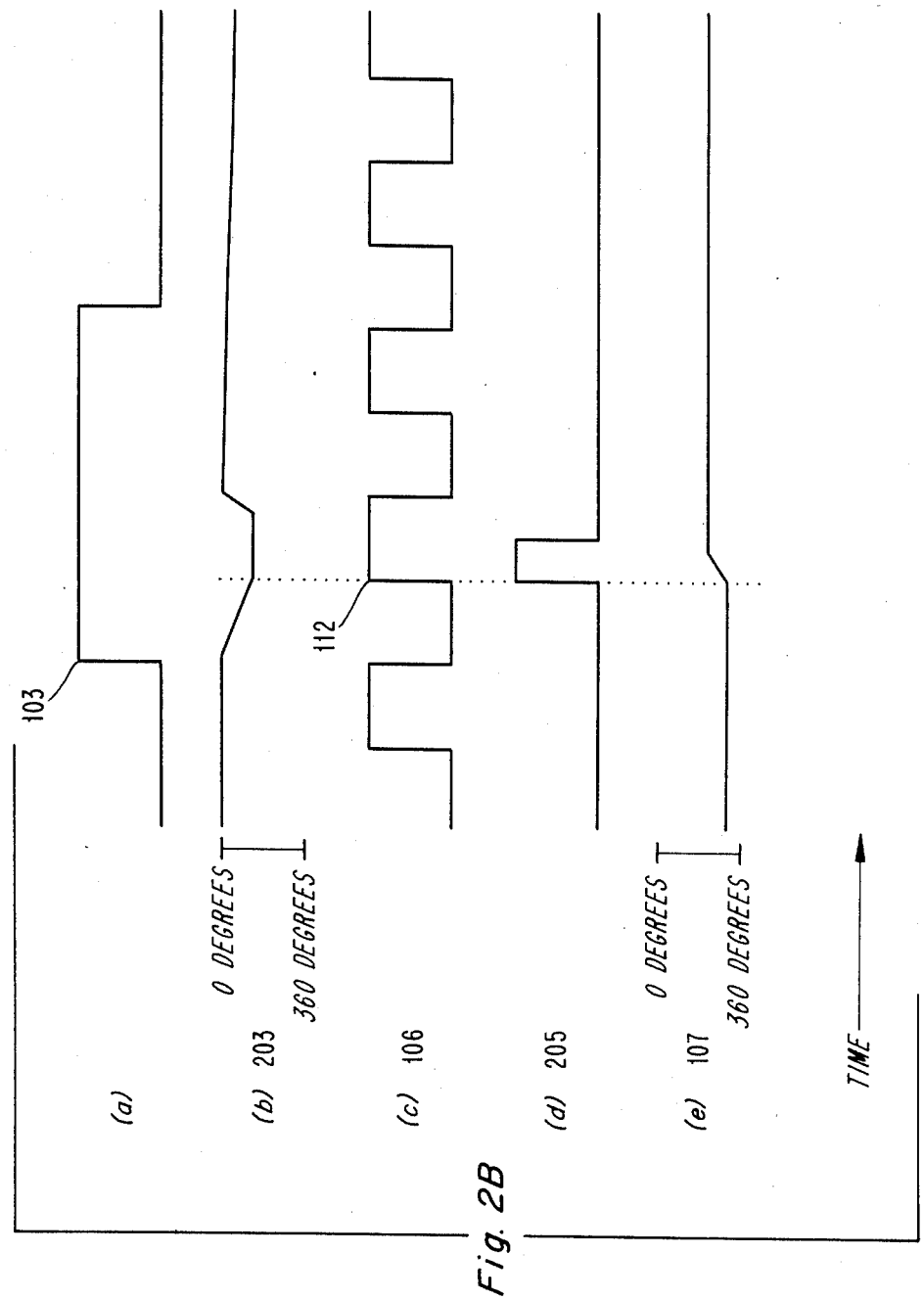

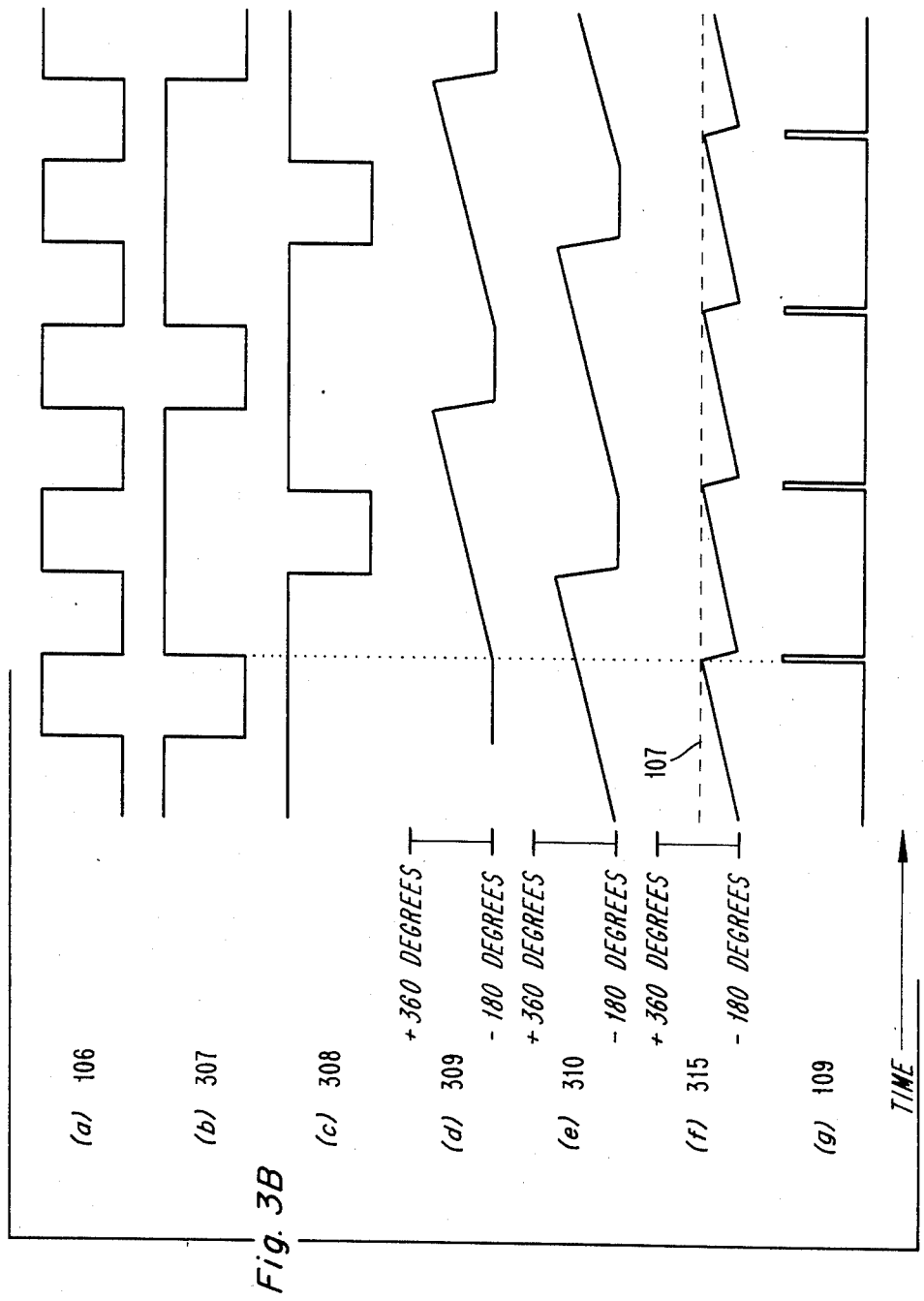

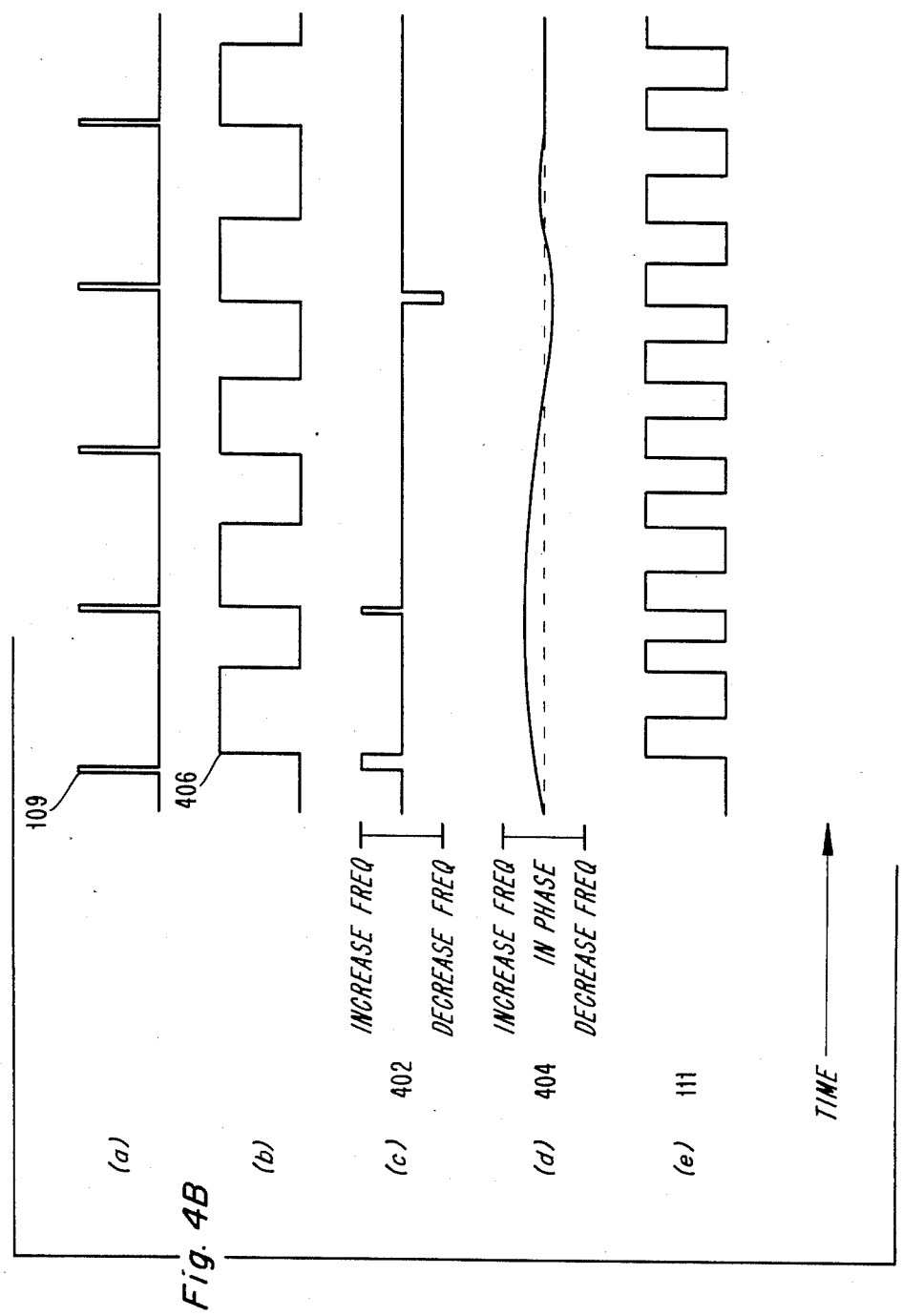

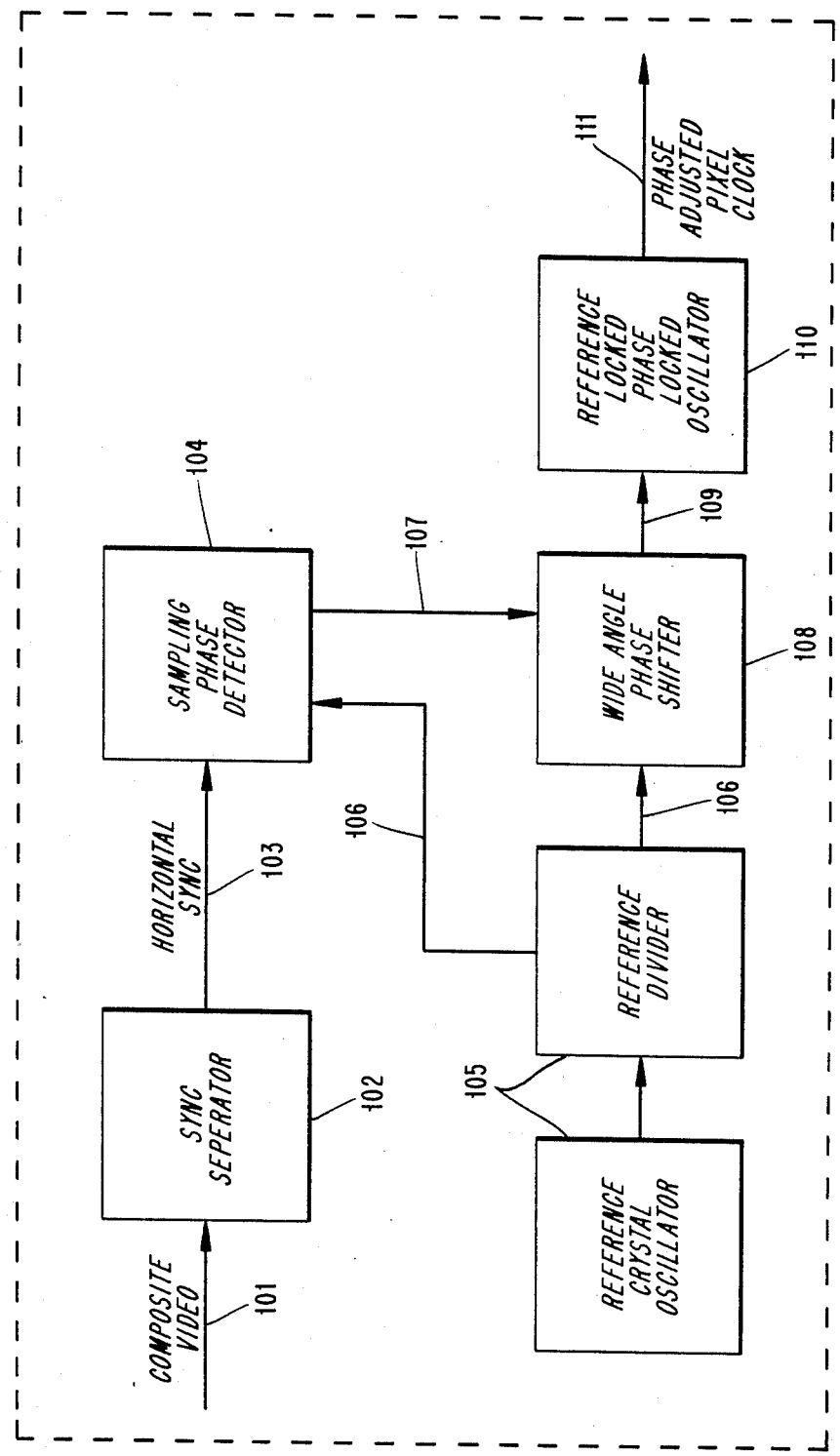

APPARATUS FOR GENERATING SIGNALS SYNCHRONIZED TO AN UNSTABLE EXTERNAL SIGNAL

BACKGROUND OF THE INVENTION

1. Field of the Invention

This invention relates generally to the field of signal synchronizing apparatus and more specifically to apparatus for synchronizing internally generated signals to an input signal in a manner which facilitates extraction of information from the inputted signal or from other signals locked to the inputted signal or which facilitates the generating of a signal containing information, which signal is synchronized to the inputted signal.

2. Description of the Prior Art

Present day techniques used to synchronize signals within a system, such as a video signal genlock device, clock recovery device, or the like, to externally generated signals rely on the stability of the externally generated signal which acts as an input reference signal and on the uninterrupted presence of the reference signal and on the uninterrupted presence of the reference signal to maintain a known relationship between the reference and internally generated signals.

One known technique assumes that the externally generated input reference signal will be very stable with changes in its characteristics occurring slowly over many cycles of the reference signal. This technique provides accurate and stable synchronization between the reference and generated signals as long as the reference signal remains stable, and drift in phase and frequency of the input reference signal is minimized between reference cycles. This technique is used primarily where many cycles (i.e. up to hundreds) of the generated signal must occur between phase reference signals without the relationship of the generated signal to the reference signal becoming indeterminate. Long term drift in the input reference signal can be accurately followed in the generated signal. Rapid or nearly instantaneous changes in the reference will, however, require the occurrence of several cycles of the reference signal before close synchronizaton between the reference and the internally generated signals is again achieved.

Another known technique assumes that the reference signal will change frequently and quickly. This technique is useful when the frequency ratio of reference to generated signals is small. A system using this type of technique can track the reference signal changes and acquire synchronization quickly after a change but still requires several reference cycles to achieve close synchronization after such a change occurs. Such a system, however, cannot hold synchronization if the inputed reference signal is interrupted or distorted, because the system will attempt to track the reference signal distortion or will rapidly drift away from the desired phase relationship between the reference signal and the generated signal during an interruption of the reference signal.

In both of the aforementioned techniques, the frequency and duration of periods during which synchronization is lost determines how accurately information can be manipulated within the system and must be considered when utilizing synchronization techiques to extract information from or insert information into a signal. An additional consideration is the amount of data that can be transferred when the synchronizing reference signal and information are contained in the same signal. The portion of the signal containing reference information subtracts from the total amount of useful information that can be conveyed in the signal. Known techniques either use a large amount (up to 50%) of the signal to contain reference information to obtain the best possible synchronization or use a lesser portion of the signal for reference information and assume that a stability of the signal will assure accurate information manipulation.

In cases where the inclusion of externally generated input reference information throughout the signal is not practical and long term stability of the signal is uncertain, only compromise techniques are currently available to attempt achieving the desired synchronization of signals.

From the foregoing considerations, it should be apparent that there is a great need for apparatus which improves rapid synchronization between an internally generated signal and a variable external signal. It is, therefore, an object of the invention to provide apparatus with the improved signal synchronization.

Another object of the invention is to allow rapid, accurate, and stable phase synchronization of an external reference signal to an internally generated signal even when the nature of the reference signal changes rapidly and drastically.

A further object of the invention is to allow a single input reference cycle to contain all required synchronizing information, to allow synchronization to be achieved quickly requiring only one occurrence of the input phase reference signal and only a few cycles of the generated signal, and to allow the synchronization to be maintained even when the ratio of a generated signal frequency to the reference signal frequency is very large.

Other objects and features of the present invention will further become apparent hereinafter with reference to the accompanying drawings and detailed description of the invention.

SUMMARY OF THE INVENTION

To achieve the foregoing objects and in accordance with the purpose of the invention, as embodied and broadly described herein, the apparatus for synchronizing an internally generated signal with an externally generated signal having a specific point which may occur periodically or aperiodically to generate a periodic output signal synchronized with the specific point on the externally generated signal comprises means, such as a local reference signal source, for generating a local reference signal; means, such as a sampling phase detector, for comparing the externally generating and holding stable between specific points on the externally generated signal a sampled phase difference signal, the sampled phase difference signal representing the phase angle at which the previous specific point on the externally generated signal occurred with respect to the internally generated signal. The apparatus also includes means, such as a wide angle phase shifter, connected to receive the sampled phase difference signal and the local reference signal for generating a phase shifted local reference clock signal, the phase shifted local reference clock signal having a cycle equal in period to the internally generated signal but shifted in phase with respect to the internally generated signal by an amount equal to the phase angle; and means, such as a reference locked phase locked oscillator, connected to receive the phase shifted local reference clock signal for generating the output signal synchronized and phase locked to the externally generated signal. The apparatus may also include a means, such as a signal conditioner, connected to the sampling phase detector for conditioning the externally generated signal for comparison against the local reference signal in the sampling phase detector.

BRIEF DESCRIPTION OF THE DRAWINGS

The accompanying drawings, which are incorporated in and constitute a part of this specification, illustrate a preferred embodiment of the invention and, together with the description, serve to explain the principles of the invention.

FIG. 1A illustrates in block diagrammatic form a preferred embodiment of the invention.

FIG. 2B illustrates some of the signals generated in the sampling phase detector shown in FIG. 2A.

FIG. 3B illustrates some of the signals generated in the wide angle phase shifter shown in FIG. 3A.

FIG. 4B illustrates some of the signals generated in the reference locked phase locked oscillator shown in FIG. 4A.

FIG. 5 illustrates one specific application of the invention in which phase synchronization of a high frequency clock to a horizontal sync signal edge of a video signal is achieved.

DESCRIPTION OF THE PREFERRED EMBODIMENT

Reference will now be made in detail to the present preferred embodiment of the invention as illustrated in the accompanying drawings.

Figure 1B:
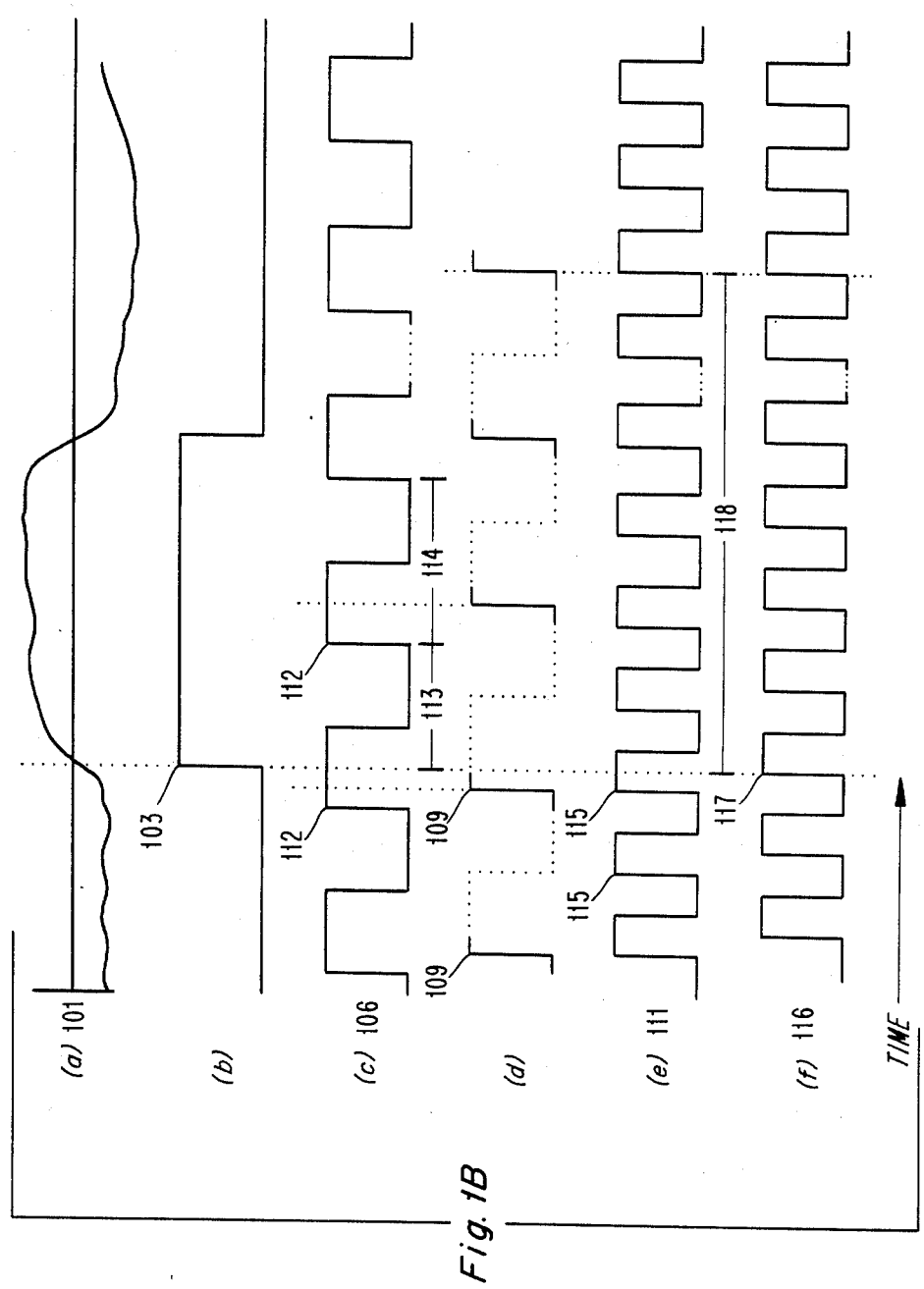
FIG. 1B illustrates the desired relationship between the input phase reference signal, local reference signal, and the output signal of the invention as shown in FIG. 1A.

Referring now to the drawings, wherein like reference characters designate like or corresponding parts throughout the several drawings, there is shown in FIG. 1A in block diagrammatic form a preferred embodiment of the invention. In FIG. 1B is shown associated signal waveforms for the embodiment illustrated in FIG. 1A. As will be more fully described below, the externally generated signal or external input phase reference signal 101 is a signal defined as a time reference occurring periodically or aperiodically to which a specific point within a periodic generated output signal 111 must be aligned.

As shown in FIG. 1A, the apparatus includes means for generating an internal clock reference signal, such as a local reference signal source 105 which, for example, is a reference crystal oscillator or other type of clock, and means for comparing the externally generated signal 101 against an internally generated signal or reference clock signal 106 for generating and holding stable between specific points on the externally generated signal 101 a sampled phase difference signal 107. As embodied herein, such comparing means is a sampling phase detector 104 which is discussed in detail below, the construction and operation of which will be obvious to one skilled in the art in light of the teachings of this specification and the accompanying drawings.

The preferred embodiment of the apparatus illustrated in FIG. 1A also includes means connected to receive the sampled phase difference signal 107 and the local reference signal 106 for shifting the phase of the internally generated reference signal 106 to generate a phase shifted local reference clock signal edge 109. Preferably, such means is a wide angle phase shifter 108 which is described in greater detail below, the construction and operation of which will be obvious to one skilled in the art in light of the teachings of this disclosure. Finally, the preferred embodiment of FIG. 1A contains means connected to receive the phase shifted local reference clock signal 109 for generating the output signal 111 synchronized and phase locked to the externally generated signal 101. Such means, as embodied herein, is a reference locked phase locked oscillator 110 which is described in greater detail below, the construction and operation of which will be obvious to one skilled in the art from the teachings of this specification and the accompanying drawings.

Additionally, depending on the particular application of the invention and that application's specific external input phase reference signal 101 configuration, the preferred embodiment illustrated in FIG. 1A may include means connected to the sampling phase detector 104 for conditioning the externally generated signal 101 for comparison against the local reference signal 106. Preferrably, such means is signal conditioner 102, the selection of which would be obvious from the teachings herein to one of ordinary skill depending upon the specific application of this invention with its specific external input phase reference signal 101. For example, the signal conditioner 102 could be a comparator or the like. If a phase reference edge is not presently contained in signal 101, the signal conditioner 102 will produce a phase reference edge 103 which accurately reflects the time at which the desired synchronizing event occurs in the external input phase reference signal 101.

Prior to discussing in greater detail the components of the preferred embodiment illustrated in FIG. 1A, a discussion of the associated waveforms illustrated in FIG. 1B is presented. Referring to FIG. 1B, the external input phase reference signal 101 (waveform (a) of FIG. 1B), which is merely a typical example determined by the specific application to which the invention is applied, is conditioned (if necessary) to provide the phase reference edge 103 (waveform (b)) at the specific point in time at which phase alignment of the output signal 111 to the phase reference signal 101 is to occur.

The time between the occurrence of the phase reference edge 103 and the next occurrence of a positive-going transition edge 112 (waveform (c)) of the reference clock signal 106 from local reference signal source 105, which is indicated by time-between-edges 113 (waveform (c)), indicates the phase relationship between the phase reference signal 101 and the reference clock signal 106. A time measured from the phase reference edge 103 to the reference clock transition edge 112 equal to zero indicates that the edges 103 and 112 and, thus, the input phase reference signal 101 and the local reference clock signal 106 are in phase.

A time between the two edges 103 and 112 greater than zero and up to the cycle time 114 (waveform (c) of FIG. 1B) of the reference clock 105 indicates that the local reference clock signal transition edge 112 lags the phase reference edge 103 in phase. The magnitude of this reference phase difference equals the ratio of the time-between-edges 113 to the cycle time 114 of the reference clock 105. This ratio, which has a value from 0 to 1, may be expressed in more conventional form as the phase angle by which the reference clock signal 106 lags the phase reference edge 103. The magnitude of this angle is defined as the aforementioned ratio multiplied by 360 degrees and, thus, will have a value from 0 to 360 degrees.

Since the local reference clock 105 produces a periodic waveform 106 of known frequency, once the phase angle is known at which the phase reference edge 103 intercepts one cycle of the reference clock signal 106, a series of phase shifted local reference clock signals or edges 109 (waveform (d) of FIG. 1B) can be generated. These phase shifted local reference edges 109 are generated such that an edge occurs once during each subsequent reference clock signal 106 cycle at the same phase angle in the cycle as the phase reference edge 109 intercepted the reference clock signal 106 cycle, with the angle of edge 109 changing from that value determined by the previous edge of the input phase reference signal 103 to a new value determined by the new input phase reference edge 103 on the occurrence of the next cycle of the local reference clock.

Generated by the wide angle phase shifter 108, these reference edges 109 may then be used to synchronize the generated output signal 111 in reference locked phase locked oscillator 110 of FIG. 1A by adjusting the frequency and phase of output signal 111. This synchronization is such that each edge (or every nth edge if the output signal frequency is an nth multiple of the reference clock signal 106 cycle) of the output signal 111 occurs at an integral multiple of reference clock periods from the occurrence of the last phase reference edge 109. Thus, if the synchronized output signal 111 were extended backward in time, as shown by signal 116 (waveform (f) of FIG. 1B) at constant frequency, then edge 117 would be aligned with the phase reference edge 103 at its last occurrence.

The time between the occurrence of the phase reference edge 103 and the point at which the output signal 111 becomes aligned to the phase shifted local reference edges 109 is the capture time 118 of the apparatus as shown in waveform (d) and (e) of FIG. 1B.

As briefly described above, FIG. 1A illustrates in block diagrammatic form the major functional components of a preferred embodiment of the invention. As shown in FIG. 1A, the input phase reference signal 101, which may be of any form (analog, digital, or other) from which information indicating a synchronizing signal can be extracted, is passed through a signal conditioner 102 if necessary. The signal conditioner 102 is designed to extract the synchronizing signal from the external input phase reference signal 101 to produce the phase reference edge 103 (waveform (b) of FIG. 1B) at the output of the signal conditioner. If the input phase reference signal 101 is already in condition to contain the necessary phase reference edge 103, then the signal 101 may be applied directly to sampling phase detector 104 without the need of the intervening signal conditioner 102.

Figure 2A:
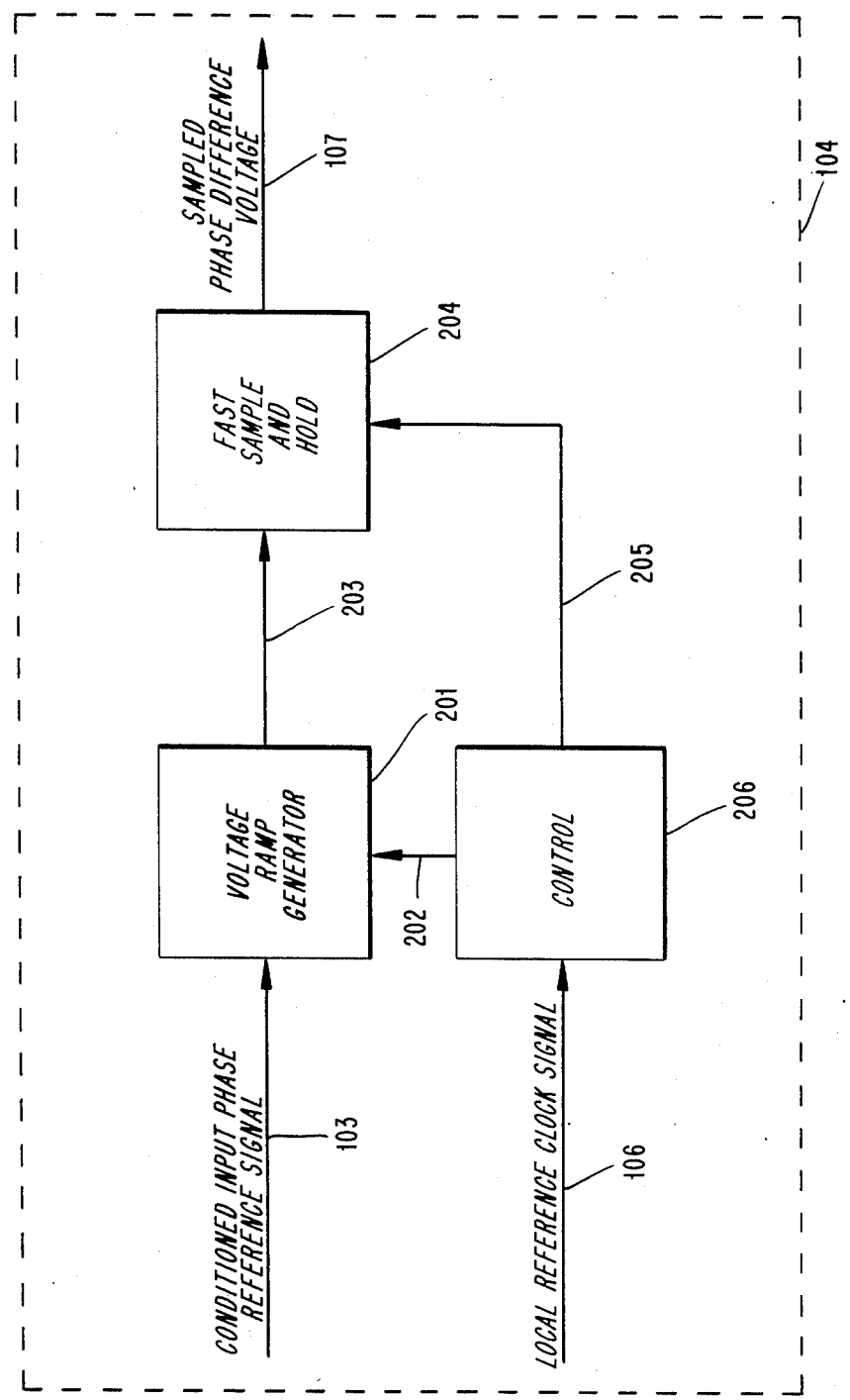
FIG. 2A illustrates in block diagrammatic form a preferred embodiment of the sampling phase detector of the invention shown in FIG. 1A.

Upon each occurrence of the phase reference edge 103, the sampling phase detector 104 generates a sampled phase difference voltage 107 (see FIG. 2A and waveform (e) along with waveform (a) and (c) of FIG. 2B) proportional to the elapsed time between the phase reference edge 103 and the next occurrence of a transition edge 112 of the reference clock signal 106. This voltage 107 is held stable at the output of sampling phase detector 104 until the next occurrence of a phase reference edge signal 103.

Figure 3A:
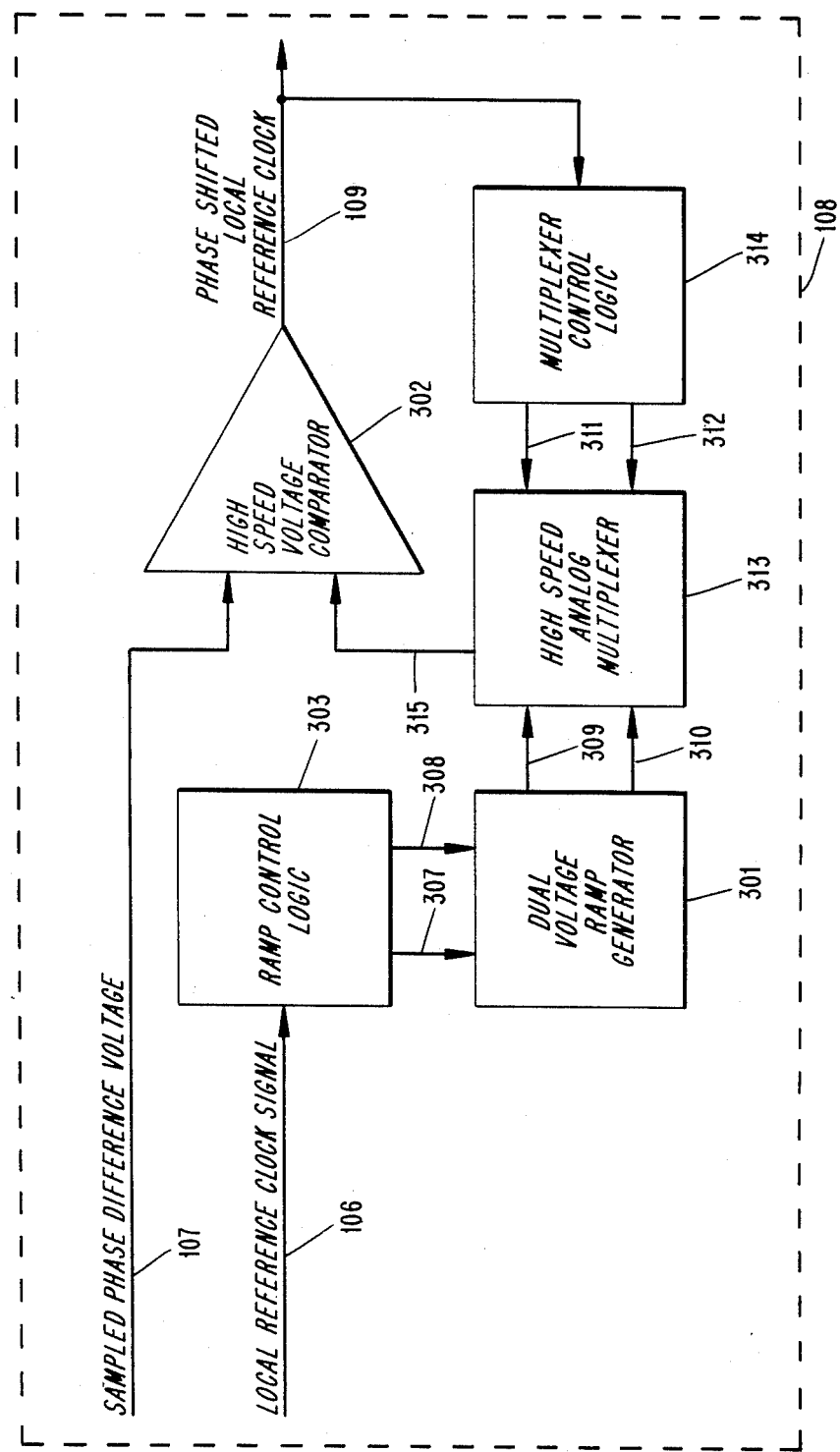
FIG. 3A illustrates in block diagrammatic form a preferred embodiment of the wide angle phase shifter of the invention shown in FIG. 1A.

The sampled phase difference voltage 107 is fed to the wide angle phase shifter 108 which produces phase shifted local reference clock signal or edges 109 (see FIG. 1A and waveform (d) of FIG. 1B; FIG. 3A and waveform (g) of FIG. 3B; and FIG. 4A and waveform (a) of FIG. 4B). Edges 109 occur leading the reference clock signal 106 transition edge 112 by the same phase angle as did the last occurrence of the phase reference edge 103.

The phase shifted reference edges 109 are passed to the reference locked phase locked oscillator 110 as shown in FIG. 1A which produces the output signal 111 in the desired form (analog, digital, or other) at a frequency equal to or a multiple of the frequency of the local reference clock 105. After the capture time 118 (waveform (e) of FIG. 1B) has elapsed, the beginning of each cycle of output signal 111 (or every nth cycle if the output frequency is an nth multiple of the reference clock frequency) will occur at a time which is an integral number of reference clock cycle times after the occurrence of the phase reference edge 103.

Each major component shown in FIG. 1A will now be described in greater detail, referring when necessary to a more detailed block diagram of a preferred embodiment of the specific component and to a diagram of the signals present in that component. The construction, function, and operation of each component will, in light of the teaching of this specification and accompanying drawings, be readily known to one skilled in the art. Thus, precise circuitry and extensively detailed descriptions of each component is unnecessary.

The signal conditioner component 102 is determined and defined by the application of the invention being exercised and is dependent upon the specific signal to which the application is designed to synchronize the output signal 111. If not already provided directly by the signal 101, the signal conditioner 102 produces a phase reference edge 103 which accurately reflects the time at which the desired synchronizing event occurs in the external input phase reference signal 101.

The local reference signal source 105 is also defined by the desired application of the invention. It is typically a stable digital clock source derived from a crystal oscillator or derived from an otherwise generated analog, digital, or other type of period signal source. In some applications, the reference signal source could be derived from the phase reference input signal 101 itself giving the invention the capability of synchronizing the output signal 111 to a varying input frequency as well as to a varying phase reference.

A preferred embodiment of the sampling phase detector 104 is shown in block diagrammatic form in FIG. 2A, and its associated signal waveforms are shown in FIG. 2B. Prior to receipt of a phase reference edge 103, the voltage ramp generator 201 outputs a quiescent or zero phase difference voltage 203 (waveform (b) of FIG. 2B). Upon receipt of the phase reference edge 103, the phase difference voltage 203 begins to change linearly with respect to time, generating a voltage ramp. Upon receipt of the next transition edge 112 (waveform (c)) of the local reference clock signal 106, the control block 206 illustrated in FIG. 2A causes the ramp generation to stop. Thus, a phase difference voltage level 203 is generated which represents the angle at which the phase reference edge 103 led the reference clock signal transition edge 112. This voltage 203 can represent an angle of 0 to 360 degrees.

Upon the termination of the ramp generation at the receipt of the reference signal transition edge 112 (waveforms (b) and (c) of FIG. 2B), the control block 206 also sends a signal 205 (waveform (d)) to the fast sample and hold circuit 204, causing it to sample the phase difference voltage 203. The sampled phase difference voltage 107 outputted by the sample and hold circuit 204 is updated smoothly without an abrupt change from its level representing the angle sampled at the previous phase reference 103 to that sampled at the current phase reference edge 103.

Once the sample and hold sequence is completed, the control block 206 causes the output 203 of the voltage ramp generator 201 to return to its quiescent state to await the next phase reference edge 103. The new phase difference voltage 203 is held constant until the next phase reference edge occurs. (See waveforms (a) and (b) of FIG. 2B.)

Illustrated in FIG. 3A is a preferred embodiment of the wide angle phase shifter 108 of FIG. 1A. The phase shifter 108's associated signal timings are shown in FIG. 3B. A ramp control logic 303 receives the local reference clock signal 106 and generates two ramp control signals 307 and 308 which have a frequency equal to one half the frequency of local reference clock signal 106 and are 180 degrees out of phase with each other as shown in waveforms (a), (b), and (c) of FIG. 3B. The signals 307 and 308 are used to gate a dual voltage ramp generator 301 which produces two voltage ramps 309 and 310 (waveforms (d) and (e)). Each voltage ramp 309 and 310 follows its ramp control signals 307 and 308, respectively, with each returning to its quiescent voltage when its ramp control voltage is low and rising linearly with respect to time when its ramp control voltage is high as shown in FIG. 3B.

As illustrated in FIG. 3A, the two ramp voltages 309 and 310 are fed to an analog multiplexer 313 which applies one of the two signals 309 or 310 as signal 315 (waveform (f) of FIG. 3B) to one input of a voltage comparator 302. The other input of the voltage comparator 302 receives the sampled phase difference voltage 107 from the fast sample and hold circuit 204 of the sample phase detector 104. When the ramp input voltage 315 applied to the comparator 302 exceeds the sampled phase difference voltage 107, the output 109 (waveform (g) of FIG. 3B) of the comparator 302 changes state, this change being known as the phase shifted local reference clock signal or edge 109. This output 109 causes a multiplexer control logic 314 of FIG. 3A to disconnect the ramp voltage currently connected to comparator 302 and to connect instead the other ramp voltage as signal 315. When the ramp voltage 315 applied to the comparator drops below the sampled phase difference voltage 107, no switch of the ramp voltage to the comparator 302 occurs.

It can be seen from the signal diagrams that a phase shifted local reference clock edge 109 will occur at periodic intervals equal to the period of the local reference clock signal 106 and shifted in phase from the local reference clock signal over a range of 540 degrees (that is, +360 degrees to −180 degrees) and that the angle will be determined by that level of the sampled phase difference voltage 107, which may have any value between the minimum to the maximum ramp voltage.

By causing the dual voltage ramps 309 and 310 to increase in voltage with time and causing the previously mentioned phase difference voltage 203 to decrease with increasing phase difference, by calibrating the phase difference voltage 203 and thus the sampled phase difference voltage 107 so that their minimum to maximum voltage excursions equal a voltage difference required to cause a 360 degree phase shift in the phase shifted local reference clock edge 109, and by then adjusting the limiting level of the sampled phase difference voltage 107 which corresponds to a zero degree phase difference between the phase reference edge 103 and the local reference clock signal transition edge 112, the phase shifted local reference clock edge 109 will be caused to occur at a phase angle leading the local reference clock edge 112 equal to the phase angle by which the last phase reference edge 103 led the reference clock edge 112, within the range of 0 to 360 degrees.

Figure 4A:
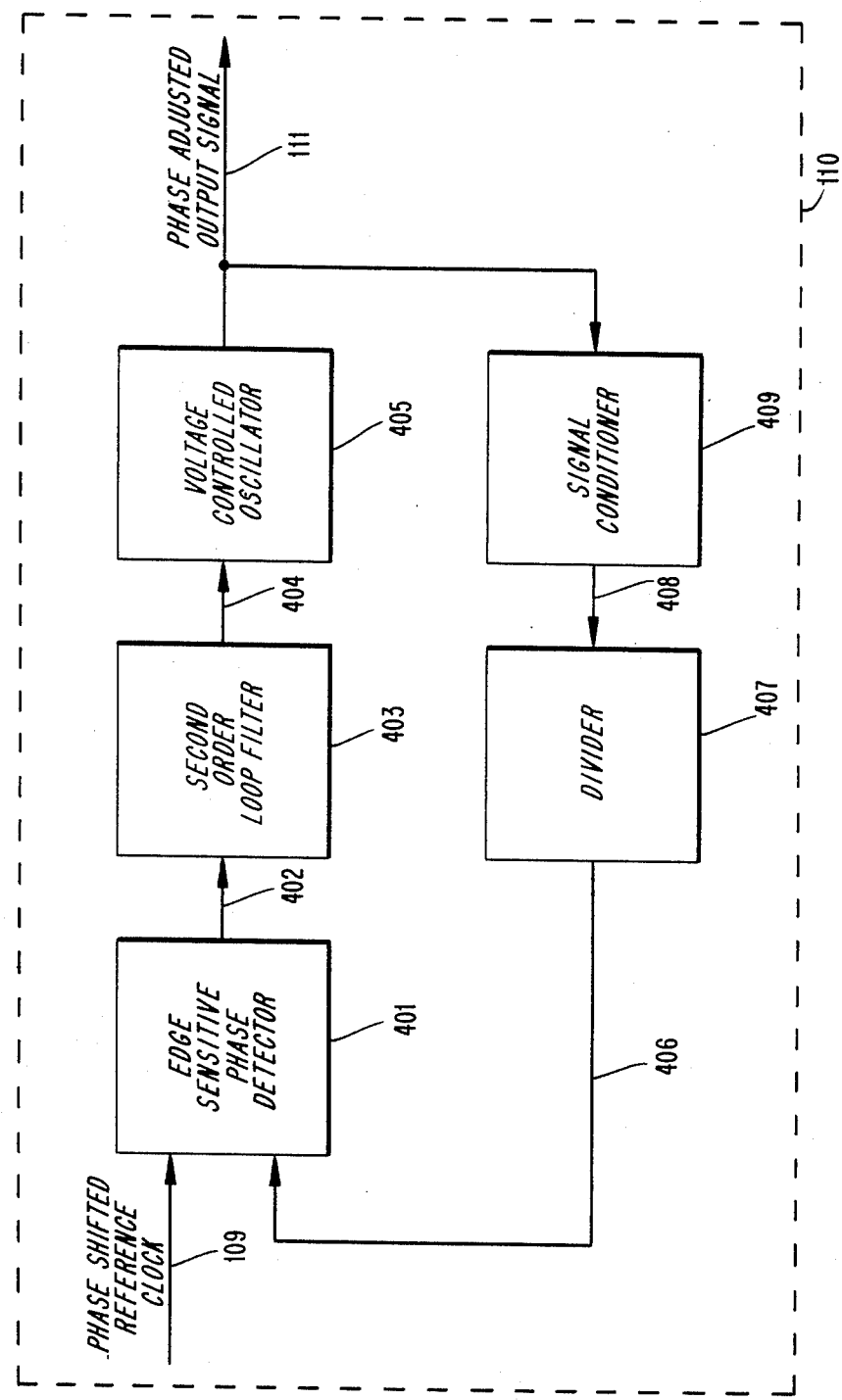
FIG. 4A illustrates in block diagrammatic form a preferred embodiment of the reference locked phase locked oscillator of the invention shown in FIG. 1A.

Shown in greater detail in FIG. 4A is the reference locked phase locked oscillator 110. Its associated signal timings are shown in FIG. 4B. By an edge sensitive phase detector 401, the phase shifted reference clock edges 109 (waveform (a) of FIG. 4B) are compared to edges of an equal frequency signal 406 (waveform (b)) derived from the phase adjusted output signal 111 (waveform (e)). The output 402 (waveform (c)) of the phase detector 401 produces pulses whose polarity indicates whether the phase shifted reference edges 109 lead or lag the output generated reference edges 406 and whose duration indicates the magnitude of the phase difference.

This output 402 is filtered by a second order loop filter 403 whose characteristics determine how quickly and accurately an oscillator 405 connected to the output of filter 403 will respond to indications that the phase of the generated signal 111 and the reference edges 109 (waveform (a) of FIG. 4B) are not precisely aligned and thus determine the capture time 118 of the system. The output of the filter 403 is a smooth phase control voltage 404 (waveform (d)) which controls the frequency and phase of the voltage controlled oscillator 405, keeping it phase aligned with the input reference signal 101 as required.

The output signal 111 is fed back through a signal conditioner 409, if necessary, to convert it from the desired output signal type to a digital signal 408 (waveform not illustrated), with edges indicating the phase of the output signal. If the output frequency is a multiple of the frequency of the local reference clock 105, the conditioned output signal 408 is divided in frequency by a divider 407 of FIG. 4A to produce generated reference edges 406 of frequency equal to that of the local reference clock signal transition edges 112.

Once variations in the phase alignment of the phase adjusted output signal 111 have settled out after receipt of an input phase reference signal 101, such time being the capture time 118 (waveform (e) of FIG. 1B), the output signal 111 will have the same phase relationship to the local reference signal 106 as did the last occurrence of the input phase reference signal 101. Thus, the alignment of the output signal 111 to the input reference signal 101 is achieved.

In operation, the apparatus described herein generates and outputs periodic signals 111 synchronized to an external signal 101 which may or may not be periodic in nature. The apparatus may contain a signal conditioner 102 to prepare the external input phase reference signal 101 for comparison against the local reference signal 106. The signal conditioner 102 assists in extracting the synchronizing reference information 103 from the input reference signal 101 and provides to the sampling phase detector 104 both the reference signal and the fact that a reference signal has been received. The local reference signal source 105 produces a repetitive signal which is compared to the reference input 101 by the sampling phase detector 104 to generate a sampled phase difference voltage signal 107. The sampling phase detector 104 generates and holds stable between reference signals a signal representing the phase angle at which a specific point on the previous reference signal 101 intercepted the local reference signal 106 cycle.

The wide angle phase shifter 108 then shifts the local reference signal 106 phase to provide a phase shifted local reference clock signal or edge 109 to the reference locked phase locked oscillator 110. The phase shifted local reference clock signal or edge 109 has a cycle equal in period to the local reference signal's 106 cycle but begins at the phase angle within the reference cycle at which the last reference signal intercepted the local reference signal. The reference locked phase locked oscillator 110 generates the output signal 111 synchronized and phase locked to the sampled input reference signal 101 such that each cycle of the output signal 111 is phase aligned to the phase shifted reference clock or to a phase angle of the phase shifted reference clock which is integrally divisible by the ratio of the generated signal frequency to the local reference signal frequency.

One particular implementation of the invention is illustrated in block diagrammatic form in FIG. 5. In that application, the invention allows the very quick synchronization of a video pixel clock with the edge of a horizontal sync pulse of an external video signal to allow information to be inserted synchronously into a video system for display or recording. Thus, in this application, the invention provides for the fast tracking of unstablized video signals which may be produced by unstabilized mechanical means such as video tapes or disks or other generation or reproduction equipment.

Obviously many modifications and variations of the present invention are possible in light of the above teachings. It is, therefore, to be understood, that within the scope of the appended claims, the invention may be practiced otherwise than as specifically described.

What is claimed is:

1. Apparatus for synchronizing an internally generated local reference signal with an externally generated signal having a specific point which may occur periodically or aperiodically to generate a periodic output signal synchronized with the specific point on the externally generated signal comprising:
   means for generating the local reference signal;
   sampling phase detector means for comparing the externally generated signal against the local reference signal for generating and holding stable between receipt of the specific points on the externally generated signal a sampled phase difference signal, the sampled phase difference signal representing the phase angle at which the previous specific point on the externally generated signal occurs with respect to the local reference signal;
   means connected to receive the sampled phase difference signal and the local reference signal for generating a phase shifted local reference clock signal, the phase shifted local reference clock signal having a cycle equal in period to the local reference signal but shifted in phase with respect to the local reference signal by an amount equal to the phase angle; and
   means connected to receive the phase shifted local reference clock signal for generating the output signal synchronized and phase locked to the externally generated signal,
   wherein the output signal is phase locked to the externally generated signal at each occurrence of a specific point of the externally generated signal and remains phase locked until the next occurrence of a specific point of the externally generated signal.

2. The apparatus of claim 1 further comprising means connected to the sampling phase detector means for conditioning the externally generated signal for comparison against the local reference signal in the sampling phase detector means.

3. The apparatus of claim 1 wherein the local reference signal includes transition edges and the sampling phase detector means includes voltage ramp generator means for receiving the externally generated signal and producing a phase difference signal representing the phase angle at which a specific point on the externally generated signal leads a local reference signal transition edge; and fast sample and hold means for sampling the phase difference signal from the voltage ramp generator means and for holding and outputting the sampled phase difference signal until the next specific point on the externally generated signal.

4. The apparatus of claim 1 wherein the means for generating a phase shifted local reference clock signal comprises wide angle phase shifter means for receiving the sampled phase difference signal and the local reference signal and for generating the phase shifted local reference clock signal.

5. The apparatus of claim 4 wherein the wide angle phase shifter means comprises ramp control logic means for receiving the local reference signal and for producing first and second ramp control signals equal to one half the frequency of the local reference signal and 180° out of phase with each other, dual voltage ramp generator means for receiving the first and second ramp control signals from the ramp control logic means and producing first and second voltage ramp signals, voltage comparator means for receiving the sampled phase difference signal on one input and for producing the phase shifted local reference clock signal on its output, multiplexer control logic means for receiving the output of the voltage comparator and for producing first and second switching signals, and high speed analog multiplexer means for receiving the first and second switching signals from the multiplexer control logic means and for receiving the first and second voltage ramp signals from the dual voltage ramp generator means for producing a multiplexed output signal to the other input of the voltage comparator means.

6. The apparatus of claim 1 wherein the means connected to receive the phase shifted local reference clock signal comprises a reference locked phase locked oscillator.

7. The apparatus of claim 6 wherein the reference locked phase locked oscillator comprises an edge sensitive phase detector, second order loop filter, voltage controlled oscillator, signal conditioner, and divider, wherein the output of the voltage controlled oscillator is the output signal synchronized and phase locked to the externally generated signal, which output signal is also input into the signal conditioner; the divider receives the output from the signal conditioner; the edge sensitive phase detector receives on one input the phase shifted local reference clock signal and on the other input the output from the divider; and the input of the second order loop filter is operatively connected to the output of the edge sensitive phase detector and the output of the second order loop filter is operatively connected to the input of the voltage controlled oscillator.

* * * * *